United States Patent
Lee et al.

(10) Patent No.: US 9,899,622 B2
(45) Date of Patent: Feb. 20, 2018

(54) ORGANIC LIGHT EMITTING DIODE DISPLAY DEVICE INCLUDING ANTIREFLECTION LINE

(71) Applicant: LG DISPLAY CO., LTD., Seoul (KR)

(72) Inventors: Jong-Kyun Lee, Gyeonggi-do (KR); Hee-Seok Yang, Gyeonggi-do (KR); Seung-Min Baik, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 523 days.

(21) Appl. No.: 13/718,349

(22) Filed: Dec. 18, 2012

(65) Prior Publication Data
US 2014/0054554 A1 Feb. 27, 2014

(30) Foreign Application Priority Data

Aug. 22, 2012 (KR) .......................... 10-2012-0091614

(51) Int. Cl.
*H01L 51/52* (2006.01)
*H01L 33/08* (2010.01)
*H01L 27/32* (2006.01)

(52) U.S. Cl.
CPC .......... *H01L 51/52* (2013.01); *H01L 27/3276* (2013.01); *H01L 33/08* (2013.01); *H01L 51/5281* (2013.01); *H01L 27/322* (2013.01)

(58) Field of Classification Search
CPC .................................. H01L 51/52; H01L 33/08
USPC ....... 257/40, 59, 72, 762, E29.068, E29.117; 438/104, 155, 151, 283, 754
See application file for complete search history.

(56) References Cited

U.S. PATENT DOCUMENTS

| | | | |
|---|---|---|---|
| 6,893,908 B2 * | 5/2005 | You et al. | 438/155 |
| 6,897,478 B2 * | 5/2005 | Koo et al. | 257/59 |
| 7,101,809 B2 * | 9/2006 | Jo | 438/754 |
| 7,230,668 B2 * | 6/2007 | Lee et al. | 349/152 |
| 7,274,042 B2 * | 9/2007 | Pai | 257/98 |

(Continued)

FOREIGN PATENT DOCUMENTS

| | | |
|---|---|---|
| CN | 1897269 A | 1/2007 |
| CN | 102386207 A | 3/2012 |

(Continued)

OTHER PUBLICATIONS

Office Action dated Jun. 27, 2014 from the Korean Intellectual Property Office in counterpart Korean application No. 10-2012-0091614.

(Continued)

*Primary Examiner* — Sheng Zhu
(74) *Attorney, Agent, or Firm* — Morgan, Lewis & Bockius LLP

(57) ABSTRACT

An organic light emitting diode display device includes: a substrate; a first antireflection line formed on the substrate and including a first metallic layer and a first inorganic layer stacked sequentially; a gate line formed on the first antireflection line; a gate insulation layer formed on the substrate and the gate line; a second antireflection line formed on the gate insulation layer and including a second metallic layer and a second inorganic layer stacked sequentially; a data line formed on the second antireflection line; and wherein the first inorganic layer connects the first metallic layer and the gate line electrically and the second inorganic layer connects the second metallic layer and the data line.

13 Claims, 6 Drawing Sheets

(56) References Cited

U.S. PATENT DOCUMENTS

| | | | | |
|---|---|---|---|---|
| 7,514,326 | B2* | 4/2009 | Han | 438/283 |
| 7,586,197 | B2* | 9/2009 | Lee et al. | 257/762 |
| 7,737,517 | B2* | 6/2010 | Kawamura et al. | 257/432 |
| 7,741,640 | B2* | 6/2010 | Seo et al. | 257/59 |
| 7,768,009 | B2* | 8/2010 | Kobayashi et al. | 257/59 |
| 7,851,245 | B2* | 12/2010 | Jun et al. | 438/48 |
| 2007/0013077 | A1* | 1/2007 | Lee et al. | 257/762 |
| 2009/0011261 | A1* | 1/2009 | Gotou | 428/469 |
| 2010/0328756 | A1* | 12/2010 | Miyashita et al. | 359/296 |
| 2012/0049191 | A1 | 3/2012 | You et al. | |

FOREIGN PATENT DOCUMENTS

| | | |
|---|---|---|
| KR | 10-2000-0057802 A | 9/2000 |
| KR | 10-2010-0137272 A | 12/2010 |
| KR | 1020120041458 A | 5/2012 |

OTHER PUBLICATIONS

Office Action dated Oct. 30, 2015 from The State Intellectual Property Office of China in counterpart Chinese application No. 201210599197.6 with partial translation.

Office Action dated Jul. 5, 2016 from The State Intellectual Property Office of China in counterpart Chinese application No. 201210599197.6.

\* cited by examiner

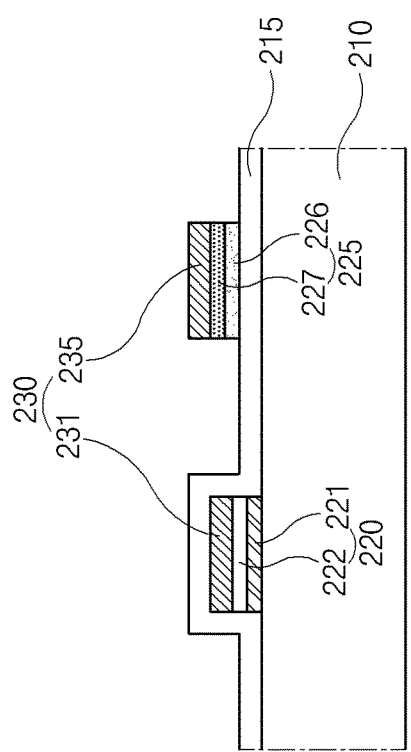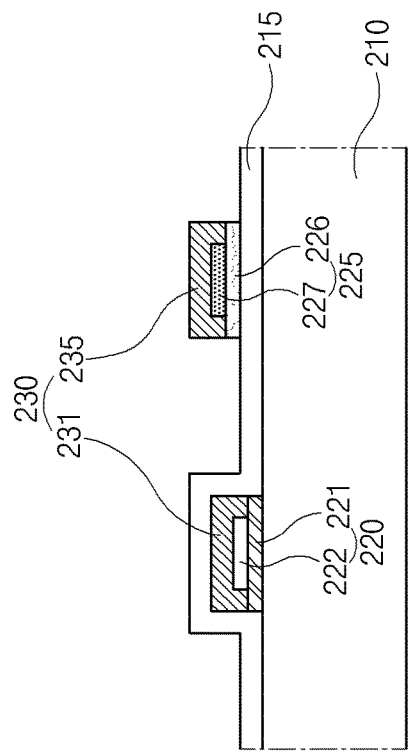

ORGANIC LIGHT EMITTING DIODE DISPLAY DEVICE INCLUDING ANTIREFLECTION LINE

This application claims the priority benefit of Korean Patent Application No. 10-2012-0091614, filed on Aug. 22, 2012, which is hereby incorporated by reference in its entirety.

BACKGROUND

Field of the Disclosure

The present disclosure relates to an organic light emitting diode display device, and more particularly, to an active matrix type organic light emitting diode display device.

Discussion of the Related Art

Recently, with rapid development of information technologies, flat panel display (FPD) devices having thin profiles and light weight have been suggested and actively pursued. The flat panel display devices are represented by a liquid crystal display devices and an organic light emitting diode display devices. Since the organic light emitting diode display devices do not need additional light sources such as backlights of the liquid crystal display devices but display sharper images than the liquid crystal display devices.

An organic light emitting diode display devices include pixels which are arranged in a screen, each of which may be comprised of sub-pixels of different colors. The sub-pixels are defined by crossing of gate lines and data lines. Each sub-pixel may be independently driven by driving elements including thin film transistors; the thin film transistors and metallic lines may be disposed in a driving element region. At this time, if the thin film transistors and the metallic lines in the driving element region reflect outside light, outer visibility may be lowered.

FIG. 1 is a cross-sectional view of illustrating a part of an active matrix type organic light emitting diode display device according to the related art.

In FIG. 1, the organic light emitting diode display device of the related art includes an organic light emitting diode 120 and a polarizer 110 formed on a substrate (not shown) through which light emitted from the organic light emitting diode 120 is transmitted to the outside.

The organic light emitting diode 120 includes an anode electrode 121, an organic light-emitting layer 122 and a cathode electrode 123.

When holes injected from the anode electrode 121 are combined with electrons from the cathode electrode 123, exitons are formed. At this time, light is emitted with a band gap energy of the organic light-emitting layer 122. The emitted light passes a color refiner 130 and is converted to a desired color.

The polarizer 110 includes a linear polarizer 111 polarizing incident light and a λ/4 phase retarder 113. The linear polarizer 111 and the λ/4 phase retarder 113 are held together in between by a first adhesive layer 112.

Light from outside is linearly polarized through the linear polarizer 111, which may be a horizontal linear polarizer. Thus, light from the outside is horizontally polarized (linear). Furthermore, the linearly polarized light is circularly polarized through the λ/4 phase retarder 113. For example, it may be left-circularly polarized. The circularly polarized light is reflected by the cathode electrode 123 and passes through the λ/4 phase retarder 113 again. When reflected, the left-circularly polarized light is right-circularly polarized. And through the λ/4 phase retarder 113 it is vertically polarized (linear). Since the vertically polarized (linear) light cannot pass through the horizontal linear polarizer 111, light from the outside cannot be reflected and the visibility can be improved.

A second adhesive layer 114 is formed outside of the λ/4 phase retarder 113 and adheres the polarizer 110 to the organic light emitting diode display device.

When the reflection of outside light is minimized using the polarizer 110, less than 45% of light emitted from the organic light emitting diode 120 is transmitted, and more than half of the brightness is deceased. Therefore, if more power consumption is used to compensate the deceased brightness, the lifetime of an organic light emitting layer 122 is reduced.

Further, since the polarizer 110 is relatively expensive, adopting polarizer 110 in order to block the reflection is not so competitive.

SUMMARY

Accordingly, the present invention is directed to an organic light emitting diode display device that substantially obviates one or more of the problems due to limitations and disadvantages of the related art.

An advantage of the present invention is to provide an organic light emitting diode display device that can reduce manufacturing costs.

An organic light emitting diode display device includes: a substrate; a first antireflection line formed on the substrate and including a first metallic layer and a first inorganic layer stacked sequentially; a gate line formed on the first antireflection line; a gate insulation layer formed on the substrate and the gate line; a second antireflection line formed on the gate insulation layer and including a second metallic layer and a second inorganic layer stacked sequentially; a data line formed on the second antireflection line; and wherein the first inorganic layer connects the first metallic layer and the gate line electrically and the second inorganic layer connects the second metallic layer and the data line.

In another aspect, an organic light emitting diode display device, comprising: a substrate; a first antireflection line formed on the substrate and including a first metallic layer and a first inorganic layer stacked sequentially; a gate line formed on the first antireflection line; a gate insulation layer on the gate line and on the substrate; a second antireflection line formed on the gate insulation layer and including a second metallic layer and a second inorganic layer stacked sequentially; a data line formed on the second antireflection line; and wherein the gate line and the data line are connected to the first and second metallic layers, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention.

FIG. 3 is a cross-sectional view illustrating first and second antireflection lines of the organic light emitting diode display device according to additional embodiments of the present invention.

FIG. 4 is a cross-sectional view illustrating an exemplary organic light emitting diode display device including first and second antireflection lines according to yet additional embodiments of the present invention.

DETAILED DESCRIPTION OF THE ILLUSTRATED EMBODIMENTS

Reference will be made in detail to exemplary embodiments of the present invention, examples of which are illustrated in the accompanying drawings.

Figure 1:
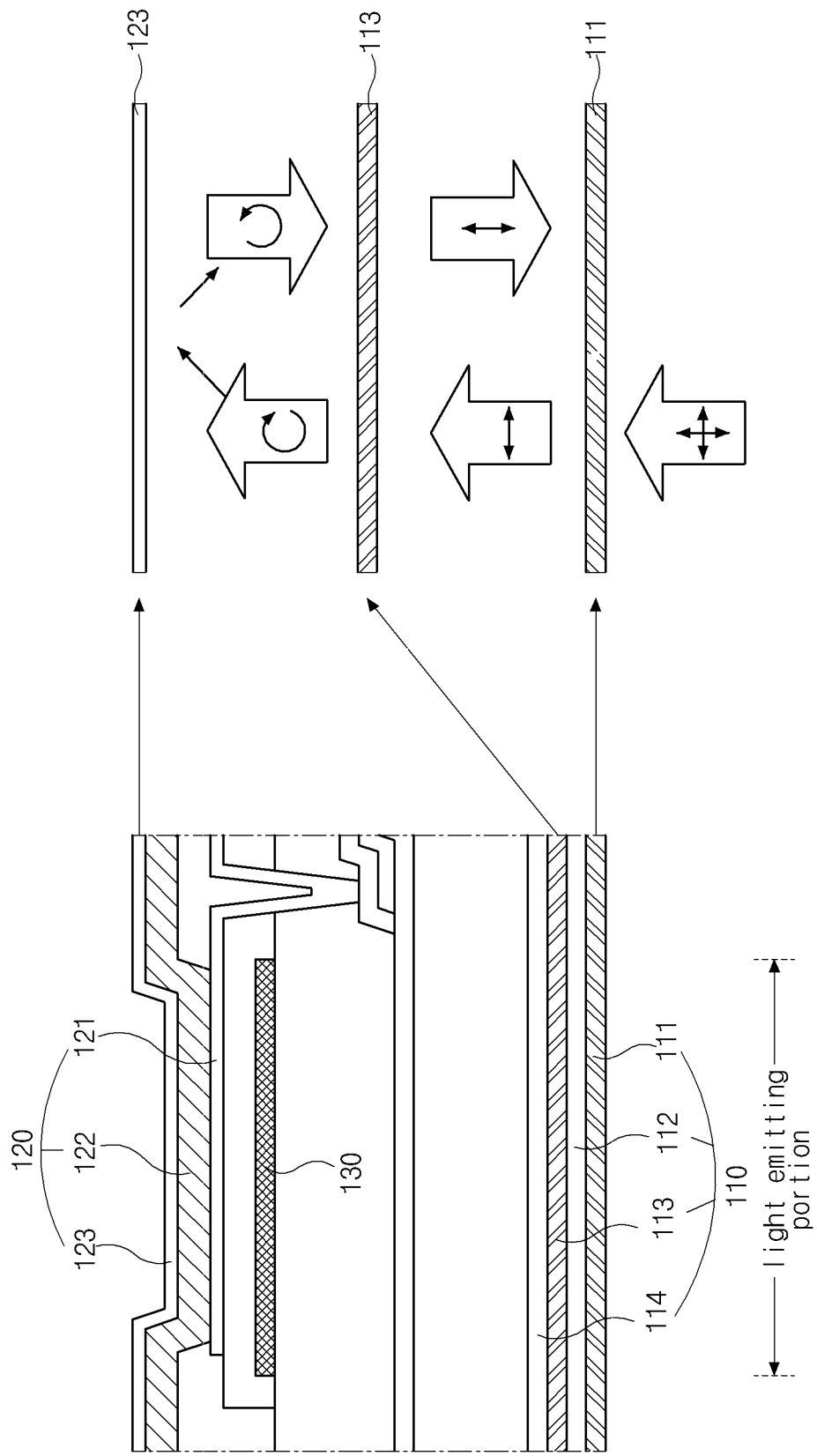
FIG. 1 is a cross-sectional view illustrating a part of an exemplary active matrix type organic light emitting diode display device according to the related art.
Figure 2:
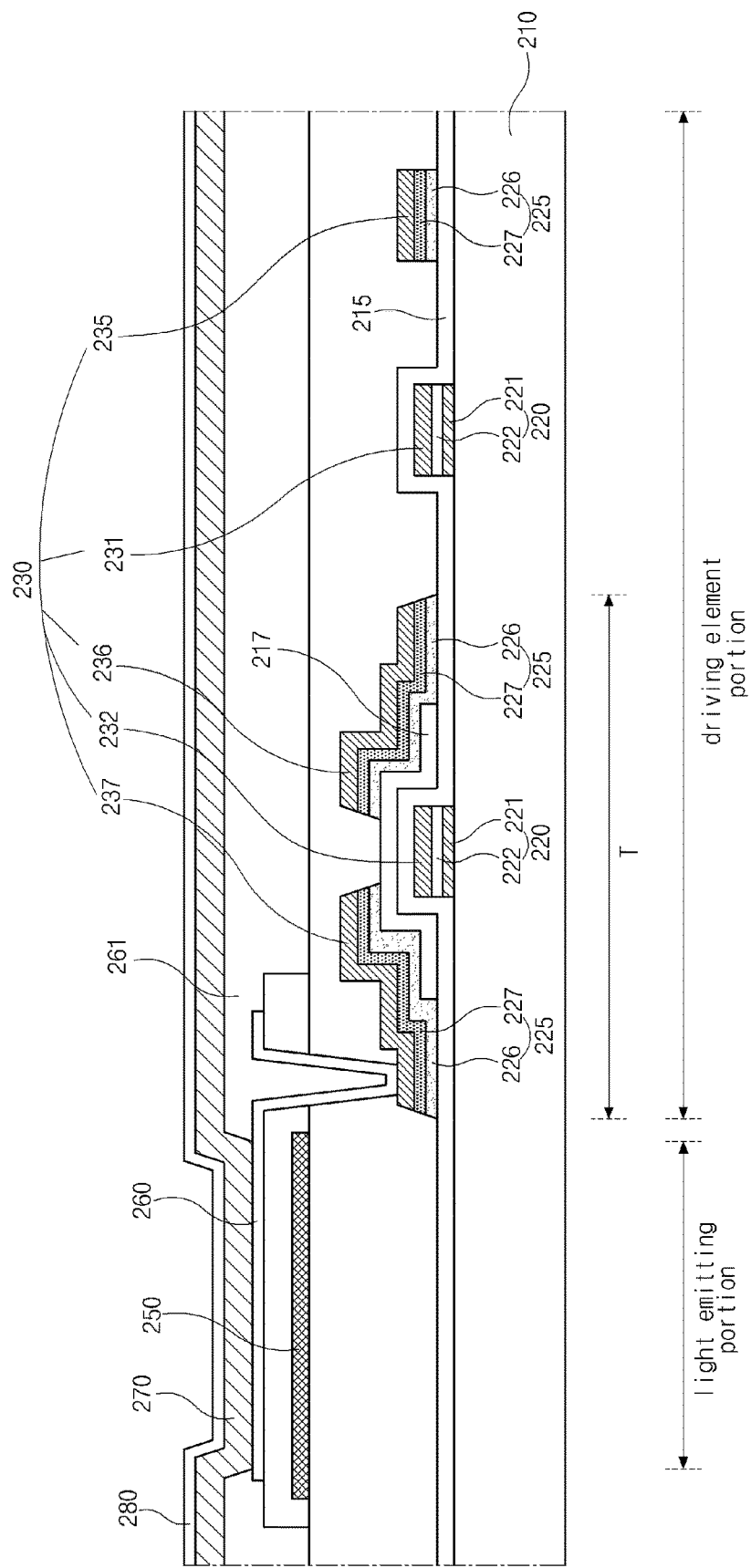
FIG. 2 is a cross-sectional view illustrating an exemplary organic light emitting diode display device according to some embodiments of the present invention.

FIG. 2 is a cross-sectional view illustrating an organic light emitting diode display device according to some embodiments of the present invention.

In FIG. 2, the organic light emitting diode display device according to some embodiments of the present invention may includes a substrate 210, first and second antireflection lines 220 and 225, a metal line 230, a passivation layer 240, a color refiner 250, and an organic light emitting layer 270.

The substrate 210 may include a plurality of pixels and the pixels may be divided into a light emitting portion and a driving element portion. The light emitting portion is an area where light emits, and the driving element portion is an area where there is no circuit for driving the organic light emitting diode display device.

The first and second antireflection lines 220 and 225 may be formed on the substrate 210 and may block reflection of light from the outside. The reflection of the outside light may occur in the metal area. Thus, blocking reflection of the outside light may enhance the visibility. The first and second antireflection lines 220 and 225 may have the same structure but may be positioned separately. The first antireflection line 220 may be formed under the gate line 231 to block reflection of the outside light at the gate line 231, and the second antireflection line 225 may be formed under the data line 235 to block reflection of the outside light at the data line 235.

Since the structures of the first and second antireflection lines 220 and 225 are same with each other, the explanation of the structure is done with regard to the first antireflection line 220. The first antireflection line 220 may include a first metallic layer 221 and a first inorganic layer 222 on the first metallic layer 221. In order to enhance the reflection blocking effect, the structure of the first metallic layer 221 and the first inorganic layer 222 may be repeated (e.g. more than 2 times) to form a multi-layered structure. Similarly, the second antireflection line 225 may include a second metallic layer 226 and a second inorganic layer 227 on the second metallic layer 226.

When the multi-layered structure is adopted, antireflection is excellent, but light transmittance of the organic emitting layer 270 may become low. Thus, the number of layers may be determined by regarding the antireflection and the light transmittance. The structure of the first and second antireflection lines 220 and 225 will be explained with reference to FIGS. 3 and 4.

The antireflection line 220 brings a destructive interference of light reflected on the metallic layer 221 and light reflected on the metal lines 230 formed on the inorganic layer 222, resulting in dissipation of the reflected lights. Therefore, if the first metallic layer 221 and the first inorganic layer 222 are formed sequentially on the substrate 210 and the metal lines 230 are formed on the first inorganic layer 222, the reflection of light from the outside may be prevented by destructive interference of the reflected light at the first metallic layer 221 through the first inorganic layer 222 and the reflected light at the metal line 230. At this time, the first metallic layer 221 may transmit light partially and the metal line does not transmit light. The principle of dissipation of light will be explained in detail with reference to FIGS. 6 and 7 below.

Meanwhile, the metal lines may be formed in the driving element portion of the pixels. The metal lines 230 include not only a gate line 231 and a data line 235 but also a gate electrode 232 elongated from the gate line 231 and a source electrode 236 elongated from the data line 235. Also, the metal lines 230 may include a drain electrode 237 of the thin film transistor.

Further, the metal lines may include lines for a compensation circuit which is a circuit for displaying correct tone of wedge of each pixel. To the compensation circuit lines, the thin film transistor, the storage electrode or a line connecting them may be included. The compensation circuit lines further includes a line formed simultaneously with the gate line 231 or the data line 235 or other lines formed on the same layer as the gate line 231 or the data line 235.

Since there are many metals in most areas of the substrate 210, the antireflection layer 220 may be formed to cover the entire substrate 210. However, since the antireflection layer 220 absorbs light emitted from the organic light emitting layer 270 in the light emitting portion, the layer 220 may cause a decrease in the brightness of light. It is possible to form the antireflection layer 220 only in the non-luminous layer by using an additional photolithography process, which will be explained later with reference to FIG. 4.

As explained above, the metal lines 230 may be formed in the driving element portion of the substrate 210. The metal lines include the gate electrode 231 of a thin film transistor, the gate line 232 and the compensation circuit line 233. The compensation circuit line 233 shown in the drawing is a part of an entire compensation circuit, and may be a storage capacitor or a line to be connected to the storage capacitor. However, according to this invention, the metal lines are not limited and can be any line simultaneously formed with the gate electrode 231 or other lines on the same layer. A power line for applying power to each pixel can also be included. The metal lines 230 are not limited to those explained above, any lines or portions that reflect light from the outside may be included.

Therefore, the first antireflection line 220 may elongate to the gate electrode 232, and the second antireflection line 225 my elongate to the source electrode 236. Additional antireflection lines may be formed to contact the metal lines 230 or in the corresponding area in the opposing direction of the incident direction of the outside light. For instance, additional antireflection lines may be formed to contact the drain electrode 23, the compensation circuit lines, or the power line or in the corresponding area in the opposing direction of the incident direction of the outside light.

Next, the passivation layer 240 may be formed on the metal lines 230 to protect the thin film transistor and the metal lines 230 and to insulate the transistor and the metal lines 230 from the peripheral elements.

Then, the color refiner 250 may be formed on the passivation layer 240 in the light emitting portion. The color refiner 250 may be positioned in an area corresponding to an area where the organic light emitting layer 270 contacts the anode electrode 260 and the cathode electrode 280. Thus, light emitting in the light emitting portion is converted to a desired color through the color refiner 250. The color refiner 250 can be recognized as the same element of the color filter of LCD device.

Meanwhile, the vertical position of the color refiner 250 may be determined according to the light emitting method. For example, in the top emission type, it may be positioned on the cathode electrode 280. And regardless of the light emitting method, it may be positioned regarding manufacturing efficiency or light emitting efficiency.

Next, the organic light emitting layer 270 may be formed on the entire substrate 210. The light emitting portion emitting light on the substrate 210 is the area where the organic light emitting layer 270 contacts the anode electrode 260 and the cathode electrode 280, and white light is emitted. The emitted light may pass through the color refiner 250 formed under the organic light emitting layer 270 and may be converted to have a particular color (e.g. one of the color of red, green, blue, yellow, magenta, and cyan), and is emitted to the outside of the substrate 210.

The light emitting process is as follows. If a current of the direction of easy flow is applied to the anode electrode 260 and the cathode electrode 280, the holes from the anode electrode 260 and the electrons from the cathode electrode 280 move to the organic light emitting layer 270 and are recombined with each other. The combined holes and electrons are called excitons. If the excitons drop to the ground state, energy is released in the form of light, and the organic light emitting layer 270 emits light.

According to the material of the organic light emitting layer 270, the color of the emitted light of the pixel varies. A white color is generally accomplished, for example, by mixing red, green, and blue light emitting materials or by stacking red, green, and blue light emitting materials to mix the color of light of the each material.

FIG. 3 is a cross-sectional view showing first and second antireflection lines 220 and 225 according to a first embodiment.

As shown in FIG. 3, the first antireflection line 220 may be formed by stacking a first inorganic layer 222 on a first metallic layer 221, and the gate line 231 may be positioned thereon. The second antireflection line 225 may be formed by stacking a second inorganic layer 227 on a second metallic layer 226, and the data line 235 may be positioned thereon The first metallic layer 221 may be a thin semi-transparent layer which reflects, transmits, and absorb light. The first inorganic layer 222 may include conductive oxide. Conductive oxide may be transparent to transmit light and electrically connects the first metallic layer 221 and the gate line 231, which may prevent occurrence of capacitance between the first metallic layer 221 and the gate line 231.

If the capacitance occurs between the first metallic layer 221 and the gate line 231, the normal transmittance of electric signal may be disturbed at the gate line 231 and the gate electrode 232 elongated from the gate line 231. Further, the disturbance may be a reason of various abnormal driving of pixels such that it is impossible to display correct tone wedge of pixels and that light emitting timing of pixels may be delayed.

Thus, by electrically connecting the first metallic layer 221 and the gate line 231 to block occurrence of parasitic capacitance, the antireflection line 220 may block reflection of the outside light and may enable correct transmittance of electric signal to the gate line 231 and the gate electrode 232.

Similarly to the first antireflection line 220, the second inorganic layer 227 of the second antireflection line 225 may include conductive oxide and may prevent occurrence of parasitic capacitance between the second metallic layer 226 and the data line 235. Thus, it is possible to block reflection of light, and it is possible to transmit correct electric signal to the data line 235 and the source electrode 236 elongated from the data line 235.

FIG. 4 is a cross-sectional view showing first and second antireflection lines 220 and 225 according to some embodiments of the invention.

As shown in FIG. 4, the first antireflection line 220 may be formed by stacking the first metallic layer 221 and the first inorganic layer 222. The first metallic layer 221 may be a thin semi-transparent layer which reflects, transmits, and absorb light. The first inorganic layer 222 may be transparent insulation material.

The first inorganic layer 222 may be positioned the gate line 231. The side edge portion of the gate line 231 may elongate on the side of the first inorganic layer 222 towards the first metallic layer 221 to be connected to the first metallic layer 221. Further, either side edge portions or one side edge portion of the gate line 231 may elongate to the first metallic layer 221. Still further, either the entire portion or a portion of the side edge area may contact the first metallic layer 221.

The second antireflection line 225 may be formed by stacking the second metallic layer 226 and the second inorganic layer 227. The second metallic layer 226 may be a thin semi-transparent layer which reflects, transmits, and absorbs light. The second inorganic layer 227 may be transparent insulation material.

On the second inorganic layer 227 may be positioned the data line 235. Like data line 231, the side edge portion of the data line 235 may elongate on the side of the second inorganic layer 227 towards the second metallic layer 226 to be connected to the second metallic layer 226. Further, either side edge portions or one side edge portion of the data line 235 may elongate to the second metallic layer 226. Still further, either the entire portion or a portion of the side edge area may contact the second metallic layer 226.

When the gate line 231 and the data line 235 are connected to the first and second metallic layers 221 and 226, respectively, occurrence of parasitic capacitance may be prevented. Thus, it is possible to block reflection of light. Moreover it is possible to transmit correct electric signal to the gate line 231 and the gate electrode 232.

Figure 5:
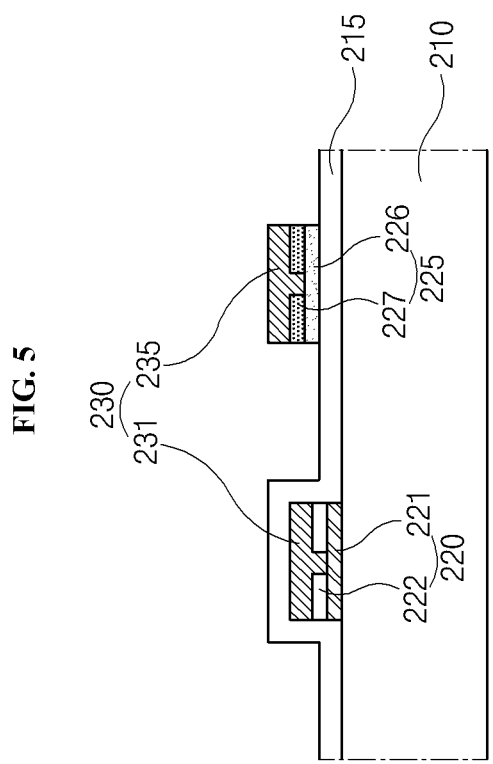
FIG. 5 is a cross-sectional view illustrating an exemplary organic light emitting diode display device including first and second antireflection lines according to further embodiments of the present invention

FIG. 5 is a cross-sectional view showing first and second antireflection lines 220 and 225 according to additional embodiments of the invention.

As shown in FIG. 5, the first antireflection line 220 may be formed by stacking the first metallic layer 221 and the first inorganic layer 222, on which the gate line 231 is disposed. The first inorganic layer 222 may be transparent insulation material and may be patterned to expose the first metallic layer 221, to which the gate line 231 is connected. More than one area of the first inorganic layer 222 may be patterned to connect the gate line 231 to the first metallic layer 221 through the more than one patterned area.

Similarly to the first antireflection line 220, the second antireflection line 225 may be formed by stacking the second metallic layer 226 and the second inorganic layer 227, on which the data line 235 is disposed. The second inorganic layer 227 may be transparent insulation material and may be patterned to expose the second metallic layer 226, to which the data line 235 is connected. More than one area of the second inorganic layer 226 may be patterned to connect the data line 235 to the second metallic layer 226 through the more than one patterned area.

Since the gate line 231 and the data line 235 are connected to the first and second metallic layers 221 and 226, respectively, occurrence of parasitic capacitance can be prevented. Thus, it is possible to block reflection of light, moreover it is possible to transmit correct electric signal to the gate line 231 and the gate electrode 232.

Figure 6:
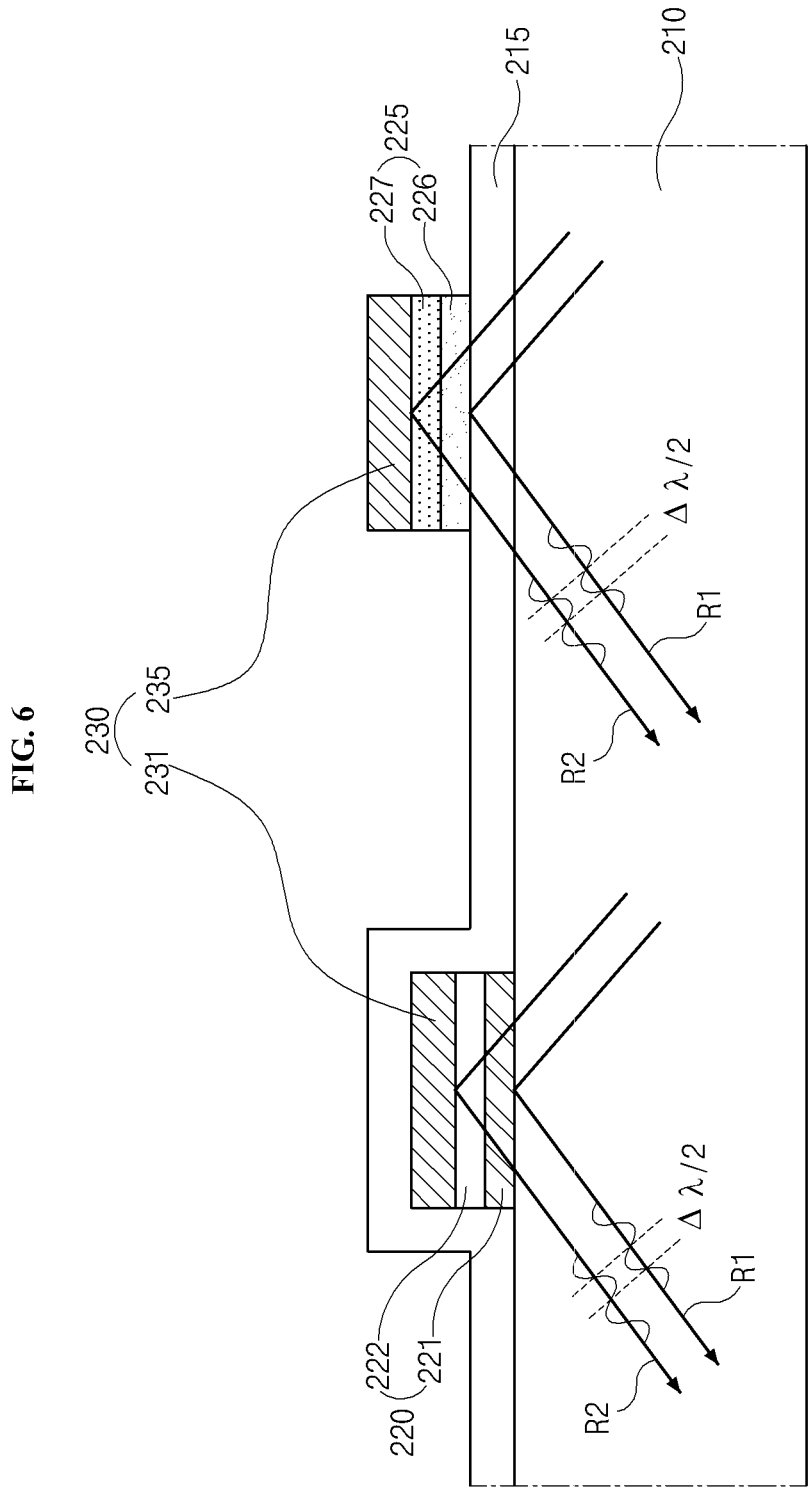
FIG. 6 is a cross-sectional view illustrating the principle of the blocking light in the metal line area according to some embodiments of the present invention.

FIG. 6 is a cross-sectional view illustrating the principle of the blocking reflection in the metal line area according to some embodiments of the invention.

As shown in FIG. 6, the first antireflection line 220 may include the first metallic layer 221 and the first inorganic layer 222, on which the gate line 231 may be formed. The antireflection line 220 may be formed by stacking the first metallic layer 221 and the first inorganic layer 222 sequentially on the substrate 210. Under the metallic layer 221, an additional inorganic layer (not shown) may be formed. And in order to increase the effect of blocking reflection, the above structure may be repeated to have a multi-layered structure.

The processes of blocking reflection of light of the first antireflection line 220 may include the following two processes. One is that of absorbing the outside light and the other is that of dissipation of light by destructive interference of light from the first metallic layer 221 and light from the gate line 231 formed on the first inorganic layer 222.

The processes will be explained in detail. If the outside light incident on the substrate 210 meets the first metallic layer 221, a portion of the light is reflected to be a first reflection light (R1); then anther portion of the light is absorbed by the first metallic layer 221 and the rest of the light is transmitted. A portion of the transmitted light is reflected at the gate line 231 to be a second reflection light (R2) and the rest of the light transmits the first inorganic layer 222. At this time, as shown in the figure, if the first and second reflection lights R1 and R2 have phase difference of $\lambda/2$, destructive interference occurs, and the reflection lights are dissipated.

To cause the destructive interference, the first metallic layer 221 may be made of a metallic material (e.g. titanium (Ti), molybdenum (Mo), chromium (Cr), or a mixture thereof) and may have a thickness from about 50 Å to about 200 Å, from about 80 Å to about 100 Å, or from about 50 Å to about 150 Å. If the materials formed as a thin film having a thickness of about 50 Å to about 200 Å, light may be partially transmitted, like the sun glasses or polarizing plates. Therefore, the transmitted light from the organic light emitting layer 270 may be emitted to the outside of the substrate 210.

The first inorganic layer 222 may be formed of a conductive oxide (e.g. Indium Tin Oxide). Since the conductive material is conductive, the parasitic capacitance that may occur between the first metallic layer 221, and the gate line 231 may be prevented. Further, since the conductive material is transparent, the time for light to reach the gate line 231 from the first metallic layer 221 is constantly maintained. In order to bring destructive interference the first inorganic layer 222 has a thickness from about 500 Å to about 3000 Å, from about 800 Å to about 2500 Å, from about 1000 Å to about 1500 Å, or from about 1000 Å to about 2000 Å.

For example, when the antireflection line 220 had a multilayered structure in which the insulation layer 222, the metallic layer 221, and the insulation layer 222 having thicknesses of 800 Å, 150 Å, and 800 Å, respectively, were stacked in sequence, light transmittance was 44%, which is bigger than the polarization plate by 1%.

The thicknesses of the first metallic layer 221 and the first inorganic layer 222 may be adjusted to cause the destructive interference. This is because that the distance between the reflection points of the first and second reflection lights (R1 and R2) may determine overlapping of peaks of the first reflection light (R1) and toughs of the second reflection light (R2).

Further, the second antireflection line 225 may also include the second metallic layer 226 and the second inorganic layer 227, on which the data line 235 is formed. The second antireflection line 225 may be formed by stacking the second metallic layer 226 and the second inorganic layer 227 sequentially on the substrate 210. Under the second metallic layer 226, an additional inorganic layer (not shown) may be formed. And, in order to increase the effect of blocking reflection, the above structure may be repeated to have a multi-layered structure.

The second antireflection line 225 may be elongated corresponding to the data line 235 elongated to the source electrode 236, thus reflection of the outside light at the gate electrode 232 can be prevented. However, since the second antireflection line 225 beneath the source electrode 236 should contact a semiconductor layer 217, a contact problem or a driving problem may occur. In this case, an additional antireflection line may be formed simultaneously with the first antireflection line 220 formed under the gate electrode 232 on the substrate 210 in the corresponding area of the source electrode 236. On the additional antireflection line may be formed an additional metallic layer of the same material as the gate electrode 232 to satisfy the destructive interference condition.

Further, a data pad portion (not shown) may be formed by elongating the data line 235 and the second antireflection line 225 can be elongated corresponding to the data pad portion. In this case, same as the case of the source electrode 236, an additional antireflection line may be formed.

As explained above, the second antireflection line 225 may be elongated corresponding to the elongated data line 235 and the area that may be elongated is not limited.

Further, since the second antireflection line 225 is under the data line 235 which is generally formed on the gate insulation layer 215, the second antireflection line 225 may be formed on the gate insulation layer 215 and contact the data line 235. Or, the second antireflection line 225 may be formed on the substrate in an area corresponding to the data line 235. In other words, the second antireflection line 225 may be formed in an area corresponding to the data line 235 to oppose the incident direction of the outside light.

When the second antireflection line 225 is formed on the substrate 210 in an area corresponding to the data line 235, it is possible to satisfy the destructive interference condition by forming an additional metallic layer on the second antireflection line 225. The additional metallic layer may form the second reflection light R2 instead of the data line 235. The additional metallic layer may be formed simultaneously with the gate electrode 232.

Meanwhile, the principle of blocking reflection of the second antireflection line 225 is the same as that of the first antireflection line 220 and utilizes destructive interference of the first and second reflection lights R1 and R2 reflected at the second metallic layer 226 and the data line 235, respectively, to block reflection of light from the outside.

The second inorganic layer 227 may be formed of a conductive oxide (e.g. Indium Tin Oxide) that is the same as the first inorganic layer 222, which is not limited. Thus, the parasitic capacitance that may occur between the second metallic layer 226 and the data line 235 may be prevented.

Meanwhile, besides the first and second antireflection lines 220 and 225, additional antireflection lines may be formed. There are many metal lines 230 within the pixel to drive the pixel besides the gate and data lines 231 and 235. The additional antireflection lines may be formed in the corresponding area of these metal lines to oppose the incident direction of the outside light.

For instance, an additional antireflection line may be formed under the drain electrode 237. In this case that is similar to the case of the source electrode 236, the additional antireflection line may be formed under the drain electrode 237 to contact the semiconductor layer 217 or an additional antireflection line may be formed simultaneously with the first antireflection line 220 formed under the gate electrode 232 on the substrate 210 in the corresponding area of the drain electrode 237.

Since the metal lines 230 may be formed simultaneously with the gate line 231 and the data line 235, the additional antireflection line may be formed simultaneously with the first antireflection line 220 or the second antireflection line 225.

Figure 7:
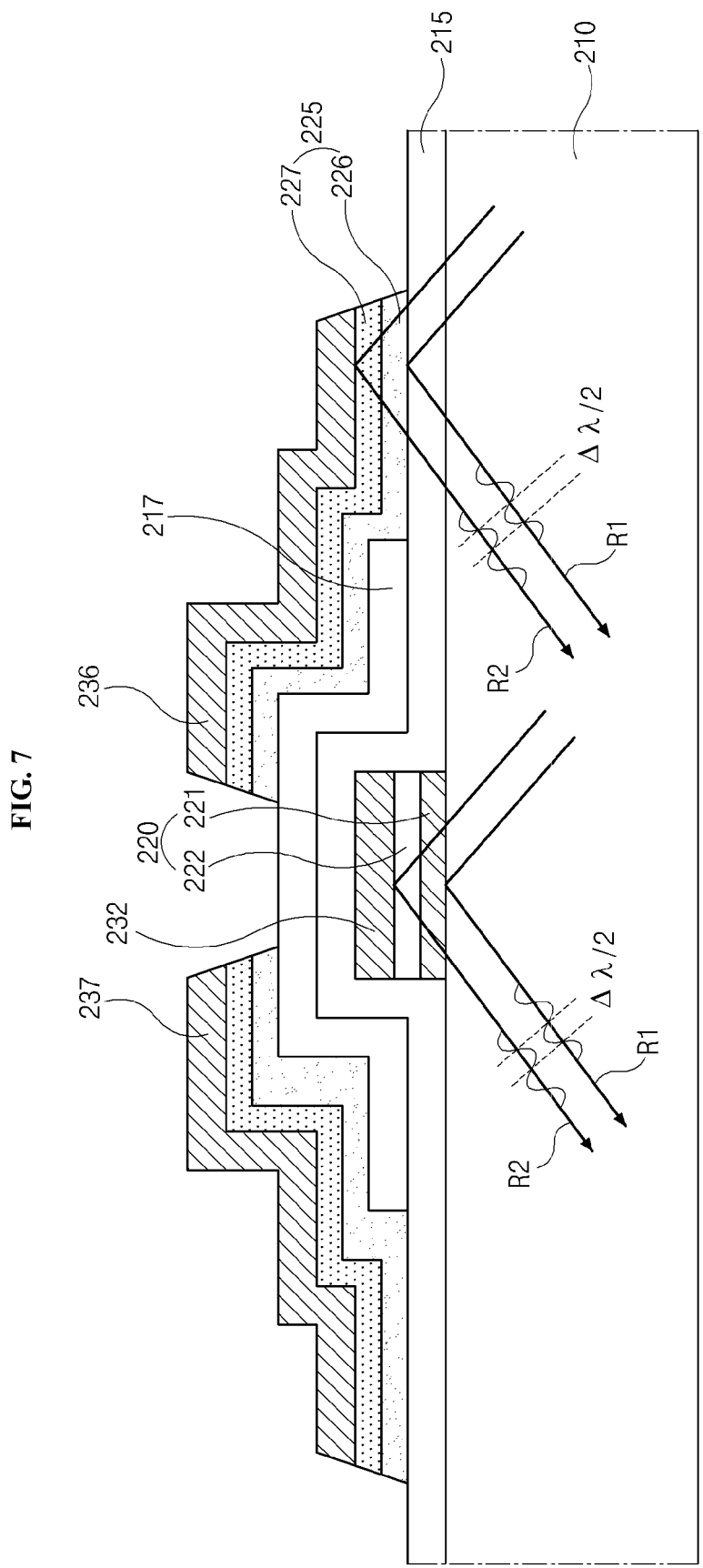
FIG. 7 is a cross-sectional view illustrating the principle of the blocking light in the thin film transistor area according to some embodiments of the present invention

FIG. 7 is a cross-sectional view illustrating the principle of the blocking reflection in the thin film transistor area according to the first embodiment of the invention.

As shown in FIG. 7, under the gate electrode 232, the first antireflection line 220 may be elongated to block reflection of the outside light at the gate electrode 232. Further, the first antireflection line 220 may be elongated to the corresponding area that the gate line 231 is elongated, for instance, to the gate pad (not shown). In other words, the elongated area of the first antireflection line 220 is not limited.

Under the source electrode 236, the second antireflection line 225 may be elongated. Since the source electrode 236 is formed to be elongated from the data line 235 (not in the figure?), the second antireflection line 225 may elongate. The second inorganic layer 227 may be conductive oxide to enable transmittance of the electric signals to the source electrode 236.

Under the drain electrode 237, an additional antireflection line may be formed separated from the second antireflection line 225. The additional antireflection lines include a metallic layer and an inorganic layer same as the first and second antireflection lines 220 and 225. The inorganic layer may be conductive oxide and enables transmittance of the electric signals to the drain electrode 237.

According to the invention, since antireflection lines having a metallic layer and an inorganic layer are adopted in order to block reflection of the outside light, the use of expensive polarization plate may be eliminated, resulting in lowering manufacturing costs.

Further, by electrically connecting the metallic layer of the antireflection line and the metal lines, the parasitic capacitance which may occur between the antireflection line and the metal lines can be prevented, resulting in signal transmittance to the metal lines can be properly controlled.

Still further, by using an antireflection line of high transmittance, the brightness can be increased and electricity consumption can be reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
a substrate;
a first antireflection line formed on the substrate and including a first metallic layer and a first inorganic layer on the first metallic layer;
a gate line formed directly on the first inorganic layer of the first antireflection line;
a gate insulation layer formed on the substrate and the gate line;
a second antireflection line formed on the gate insulation layer and including a second metallic layer and a second inorganic layer on the second metallic layer;
a data line formed directly on the second inorganic layer of the second antireflection line; and
wherein the first inorganic layer connects the first metallic layer and the gate line electrically and the second inorganic layer connects the second metallic layer and the data line, wherein the first metallic layer is a thin semi-transparent layer,
wherein the first metallic layer and the first inorganic layer of the first antireflection line are disposed under the gate line to be closer than the gate line to the substrate, and the second metallic layer and the second inorganic layer of the second antireflection line are disposed under the data line to be closer than the data line to the substrate,
wherein the first antireflection line is disposed under the gate insulation layer and the second antireflection line is disposed above the gate insulation layer.

2. The device according to claim 1, further comprising:
a gate electrode elongated from the gate line,
wherein the first antireflection line is elongated to the gate electrode.

3. The device according to claim 1, further comprising:
a source electrode elongated from the data line,
wherein the second antireflection line is elongated to the source electrode.

4. The device according to claim 1, further comprising:
a third antireflection line formed on the gate insulation layer and including a third metallic layer and a third inorganic layer stacked sequentially.

5. The device according to claim 4, further comprising:
a metal line formed on the third antireflection line,
wherein the third inorganic layer electrically connects the third metallic layer and the metal line.

6. The device according to claim 5, wherein the metal line includes a drain electrode, a power line, a storage electrode and a compensation circuit line.

7. The device according to claim 4, wherein the first, second and third metallic lines include a material selected from the group consisting of titanium (Ti), molybdenum (Mo), chromium (Cr), and a mixture thereof.

8. The device according to claim 4, wherein the first, second and third inorganic layers include a material selected from the group consisting of Indium Tin Oxide, Indium Zinc Oxide, Tin Oxide, Zinc Oxide, and a mixture thereof.

9. An organic light emitting diode display device, comprising:
- a substrate;
- a first antireflection line formed on the substrate and including a first metallic layer and a first inorganic layer on the first metallic layer;
- a gate line formed directly on the first inorganic layer of the first antireflection line;
- a gate insulation layer on the gate line and on the substrate;
- a second antireflection line formed on the gate insulation layer and including a second metallic layer and a second inorganic layer on the second metallic layer;
- a data line formed directly on the second inorganic layer of the second antireflection line; and
- wherein the gate line and the data line are connected to the first and second metallic layers, respectively, wherein the first metallic layer is a thin semi-transparent layer,
- wherein the first metallic layer and the first inorganic layer of the first antireflection line are disposed under the gate line to be closer than the gate line to the substrate, and the second metallic layer and the second inorganic layer of the second antireflection line are disposed under the data line to be closer than the data line to the substrate,
- wherein the first antireflection line is disposed under the gate insulation layer and the second antireflection line is disposed above the gate insulation layer.

10. The device according to claim 9, wherein the gate line and the data line are connected to the first and second metallic layers, respectively, at side edge area.

11. The device according to claim 9, wherein the gate line and the data line penetrate the first and second inorganic layers to be connected to the first and second metallic layers, respectively.

12. The device according to claim 9, wherein the first and second metallic lines include a material selected from the group consisting of titanium (Ti), molybdenum (Mo), chromium (Cr), and a mixture thereof.

13. The device according to claim 9, wherein the first and second inorganic layers include a material selected from the group consisting of Indium Tin Oxide, Indium Zinc Oxide, Tin Oxide, Zinc Oxide, and a mixture thereof.

* * * * *